United States Patent
Sciarrillo et al.

(10) Patent No.: US 10,593,625 B2
(45) Date of Patent: Mar. 17, 2020

(54) SEMICONDUCTOR DEVICE AND A CORRESPONDING METHOD OF MANUFACTURING SEMICONDUCTOR DEVICES

(71) Applicant: STMICROELECTRONICS S.R.L., Agrate Brianza (IT)

(72) Inventors: Samuele Sciarrillo, Usmate Velate (IT); Ivan Venegoni, Bareggio (IT); Paolo Colpani, Agrate Brianza (IT); Francesca Milanesi, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/048,123

(22) Filed: Jul. 27, 2018

(65) Prior Publication Data
US 2019/0035741 A1 Jan. 31, 2019

(30) Foreign Application Priority Data
Jul. 28, 2017 (IT) .......................... 102017000087174

(51) Int. Cl.
*H01L 23/00* (2006.01)
*H01L 23/532* (2006.01)
(Continued)

(52) U.S. Cl.
CPC .... *H01L 23/53238* (2013.01); *H01L 21/3086* (2013.01); *H01L 21/76832* (2013.01);
(Continued)

(58) Field of Classification Search
CPC ............... H01L 23/3171; H01L 23/528; H01L 23/5283; H01L 23/5227; H01L 23/5226;
(Continued)

(56) References Cited

U.S. PATENT DOCUMENTS

| | | | |
|---|---|---|---|
| 5,223,454 A | 6/1993 | Uda et al. | |
| 5,652,157 A * | 7/1997 | Hirano | H01L 23/5283 |
| | | | 257/E21.173 |

(Continued)

FOREIGN PATENT DOCUMENTS

| | | |
|---|---|---|
| CN | 103165481 A | 6/2013 |
| JP | S63249346 A | 10/1988 |

(Continued)

OTHER PUBLICATIONS

Jul. 27, 2018, Semiconductor Device and a Corresponding Method of Manufacturing Semiconductor Device.
(Continued)

*Primary Examiner* — Cuong Q Nguyen
(74) *Attorney, Agent, or Firm* — Seed Intellectual Property Law Group LLP

(57) ABSTRACT

A semiconductor device includes a passivation layer over a dielectric layer, a via through the passivation layer and the dielectric layer, an interconnection metallization arranged over said at least one via; said passivation layer underlying peripheral portions of said interconnection metallization, and an outer surface coating that coats said interconnection metallization. The coating preferably includes at least one of a nickel or nickel alloy layer and a noble metal layer. The passivation layer is separated from the peripheral portion of the interconnection metallization by a diffusion barrier layer, preferably a titanium or a titanium alloy barrier. The device includes a dielectric layer arranged between the passivation layer and the diffusion barrier layer; and a hollow recess area between the passivation layer and the end portion of the barrier layer and between the passivation layer and the foot of the outer surface coating.

20 Claims, 8 Drawing Sheets

(51) Int. Cl.
*H01L 23/538* (2006.01)
*H01L 21/308* (2006.01)
*H01L 21/768* (2006.01)
*H01L 23/528* (2006.01)
*H01L 23/31* (2006.01)
*H01L 23/29* (2006.01)
*H01L 23/525* (2006.01)

(52) U.S. Cl.
CPC .. *H01L 21/76852* (2013.01); *H01L 21/76885* (2013.01); *H01L 23/3157* (2013.01); *H01L 23/3171* (2013.01); *H01L 23/528* (2013.01); *H01L 23/5384* (2013.01); *H01L 24/03* (2013.01); *H01L 24/05* (2013.01); *H01L 23/291* (2013.01); *H01L 23/3192* (2013.01); *H01L 23/525* (2013.01); *H01L 2224/0235* (2013.01); *H01L 2224/02311* (2013.01); *H01L 2224/02331* (2013.01); *H01L 2224/02335* (2013.01); *H01L 2224/02372* (2013.01); *H01L 2224/02381* (2013.01); *H01L 2224/03015* (2013.01); *H01L 2224/0346* (2013.01); *H01L 2224/0347* (2013.01); *H01L 2224/03614* (2013.01); *H01L 2224/03914* (2013.01); *H01L 2224/0401* (2013.01); *H01L 2224/05007* (2013.01); *H01L 2224/05008* (2013.01); *H01L 2224/05017* (2013.01); *H01L 2224/05027* (2013.01); *H01L 2224/05147* (2013.01); *H01L 2224/05166* (2013.01); *H01L 2224/05181* (2013.01); *H01L 2224/05186* (2013.01); *H01L 2224/05548* (2013.01); *H01L 2224/05557* (2013.01); *H01L 2224/05566* (2013.01); *H01L 2224/05568* (2013.01); *H01L 2224/05572* (2013.01)

(58) Field of Classification Search
CPC .......... H01L 23/5228; H01L 23/53238; H01L 23/5329
See application file for complete search history.

(56) References Cited

U.S. PATENT DOCUMENTS

| | | | |
|---|---|---|---|
| 5,937,320 | A | 8/1999 | Andricacos et al. |
| 6,228,759 | B1 | 5/2001 | Wang et al. |
| 6,521,970 | B1 | 2/2003 | Takiar et al. |
| 6,528,412 | B1 | 3/2003 | Wang et al. |
| 6,756,294 | B1 | 6/2004 | Chen et al. |
| 7,166,905 | B1 | 1/2007 | Shah |
| 8,298,930 | B2 | 10/2012 | Arvin et al. |
| 8,476,762 | B2 | 7/2013 | Daubenspeck et al. |
| 8,809,951 | B2 | 8/2014 | Lin et al. |
| 8,884,418 | B2 | 11/2014 | Camacho et al. |
| 9,224,686 | B1 | 12/2015 | Chen et al. |
| 2005/0116340 | A1 | 6/2005 | Shindo |
| 2005/0215045 | A1 | 9/2005 | Rinne et al. |
| 2007/0023919 | A1 | 2/2007 | Lin et al. |
| 2007/0290343 | A1 | 12/2007 | Harada et al. |
| 2009/0102032 | A1 | 4/2009 | Schneegans et al. |
| 2010/0109159 | A1 | 5/2010 | Ho et al. |
| 2010/0171219 | A1 | 7/2010 | Moreau et al. |
| 2011/0147932 | A1 | 6/2011 | Trezza et al. |
| 2012/0064712 | A1 | 3/2012 | Lei et al. |
| 2012/0129335 | A1 | 5/2012 | Ikumo et al. |
| 2012/0139113 | A1* | 6/2012 | Arvin ............... H01L 24/11 257/751 |
| 2012/0193793 | A1 | 8/2012 | Tsukamoto |
| 2012/0248605 | A1 | 10/2012 | Yamaguchi |
| 2014/0001615 | A1 | 1/2014 | Otremba et al. |
| 2014/0361431 | A1 | 12/2014 | Matsumoto et al. |
| 2016/0035655 | A1 | 2/2016 | Howard et al. |
| 2016/0276237 | A1 | 9/2016 | Lin et al. |
| 2016/0300804 | A1 | 10/2016 | Omori |
| 2017/0053872 | A1 | 2/2017 | Lee et al. |
| 2017/0098627 | A1 | 4/2017 | Das et al. |
| 2017/0110398 | A1* | 4/2017 | Chang ............... H01L 23/5226 |
| 2017/0221840 | A1* | 8/2017 | Paleari ............... H01L 23/5283 |
| 2017/0250128 | A1 | 8/2017 | Fontana et al. |

FOREIGN PATENT DOCUMENTS

| | | |
|---|---|---|
| JP | 2009-231681 A | 10/2009 |
| JP | 2013165099 A | 8/2013 |
| WO | 9852224 A1 | 11/1998 |

OTHER PUBLICATIONS

U.S. Appl. No. 15/239,545, filed Aug. 17, 2016, Method of Manufacturing Semiconductor Devices and Corresponding Device.

* cited by examiner

SEMICONDUCTOR DEVICE AND A CORRESPONDING METHOD OF MANUFACTURING SEMICONDUCTOR DEVICES

BACKGROUND

Technical Field

The description relates to semiconductor devices.

One or more embodiments may apply e.g., to thermo-mechanical stress reduction in integrated circuits, e.g., for automotive and consumer products.

Description of the Related Art

Various types of integrated circuits (ICs) may adopt technologies such as BCD (Bipolar-CMOS-DMOS) technology.

BCD technology may be advantageously used e.g., for producing integrated circuits with both power electronics and logical control electronics. BCD technology provides a family of silicon processes, each of which combines the strengths of three different process technologies onto a single chip: bipolar for precise analog functions, CMOS (Complementary Metal Oxide Semiconductor) for digital design and DMOS (Double Diffused Metal Oxide Semiconductor) for power and high-voltage elements.

Implementing BCD technology may involve top layer copper metal interconnections, called re-distribution layer (RDL). These are thick metal layers (as opposed to thin metal layers under one micrometer ($1 \times 10^{-6}$ m) of thickness which are suitable for instance to connection through bumping.

However, resistance of passivation and intermediate insulating layers against reliability issues, as caused e.g., by thermo-elastic coupling and stresses during wire bonding and packaging processes, may represent factors deserving attention.

Silicon nitride (SiN) or silicon carbide (SiC) may be used in manufacturing ICs to provide a passivation layer for microchips, e.g., to provide a barrier against water molecules and other sources of corrosion and instability in microelectronics.

In metallizations such as Cu (copper) RDL top metallizations, stresses may arise due to thermo-mechanical mismatch between different materials e.g., barrier layer (Ti, TiN, TiW, Ta, TaNta), metallization capping layer (Ni—Pd, Ni—Pd—Au, Ni—Au), passivation layer (SiN).

In this regard in FIGS. 1A and 1B it is shown a semiconductor device in the form of a portion of integrated circuit 50, obtained with BCD (Bipolar-CMOS-DMOS) technology, where with the reference 10 is indicated a dielectric substrate, on which a passivation layer 20 is deposited.

Not represented in FIGS. 1A and 1B, under the dielectric layer 10, connected through the metal conductive leads 31, is placed active circuitry operatively associated to the portion of integrated circuit 50.

In general, the portion of integrated circuit 50 shown in FIGS. 1A and 1B corresponds to the dielectric layer of a chip or die, which is connected to active circuitry and can be connected to other chips or die, placed above or under such chip or die, in particular through the re-distribution layers.

The dielectric layer 10 is not continuous, but it is divided in four sub-layers 10a, 10b, 10c, 10d, starting from the bottom. The passivation layer 20 then lies above the uppermost sub-layer 10d.

Conductive formations, or leads, 31 corresponding to connection for the metal conduction tracks are included in the sub-layers 10a, 10b, 10c, 10d, with respective vertical vias connecting one to the other through the sub-layers 10a, 10b, 10c, 10d of the dielectric layer 10. Each of the dielectric sub-layers 10a, 10b, 10c, 10d corresponds to a dielectric layer incorporating a metal routings or silicon polycrystalline structures, for instance sub-layer 10d corresponds to metal 3 level.

With the reference 36 it is thus indicated a metal layer, representing an interconnection metallization, specifically a copper re-distribution Layer, or Cu RDL in the following, arranged over a via 22, and covered by a combined capping layer 37. The combined capping layer 37 includes an inner layer 38, which in variant embodiments may be composed by a Ni or a Ni alloy, as for instance NiP, NiPW, NiPMo, and includes an outer layer 40 which in variant embodiments may be composed of materials such as Au, Pd, or Pd/Au. Also, in variant embodiments, the re-distribution layer 36 body can be obtained using other metals such as copper alloys or gold. In the example shown the Cu RDL metal layer, i.e., the body of the copper re-distribution layer without the capping 37, has a thickness t higher than 1 micrometer with respect to the level of the upper face of a passivation layer 20 on which the Cu-RDL 36 lies.

In the description of FIGS. 1A and 1B and in the following the vertical direction designates the direction along which the layers are deposited one over the other, while the horizontal direction generally designates a direction parallel to the plane of the layers, i.e., the plane of a dielectric layer 10, as better detailed in the following. The dielectric layer 10 is intended as lying on the bottom of the stack of layers shown, while the Cu RDL 36 is on the top.

The via 22, as it is known, is an hole etched through the flat passivation nitride layer 20 and the dielectric layer 10d reaching a conductive lead 31. The via 22 is covered by a barrier layer 30, in the embodiment described as a Ti or Ta, or one of their alloys, extends horizontally for the entire width of the Cu RDL layer 36.

A triple point TP is indicated in FIG. 1A and in FIG. 1B provides a magnification of the region surrounding such triple point TP. As shown in the magnification of FIG. 1B, therefore there is a point, i.e., the triple point TP, where the metallization capping layer 38 surrounding the RDL Cu layer 36, in particular a foot 37a of the vertical wall of the metallization capping layer 37 covering the vertical wall 36a of the RDL Cu layer 36, meets the TiW barrier layer 30 and the nitride passivation layer 20.

This specifically shows how in standard conditions in structure corners the Cu RDL stresses SiN passivation for thermo-mechanical mismatch between the different materials that are in contact, labeled 30, 38 and 20.

BRIEF SUMMARY

One or more embodiments contribute to overcoming the critical issues mentioned in the foregoing, for instance the Cu RDL stressing SiN passivation for thermo-mechanical mismatch between different materials at the edge of a Cu RDL structure.

According to one or more embodiments, a semiconductor device includes a dielectric layer, a passivation layer over the dielectric layer, a via through the passivation layer and the dielectric layer, an interconnection metallization arranged over the via and having a metallization body and a peripheral portion on the passivation layer, an outer surface coating that coats the metallization body, a diffusion barrier layer separating the peripheral portion of the interconnection metallization from the passivation layer, a dielectric layer arranged between the passivation layer and the diffusion barrier layer, and a hollow recess area between the passivation layer and an end portion of the barrier layer and between the passivation layer and a foot of the outer surface coating. Preferably, the dielectric layer defines a side wall of the hollow recess area.

One or more embodiments may also relate to a corresponding manufacturing method.

The claims are an integral part of the technical disclosure of one or more embodiments has provided herein.

One or more embodiments may lead to SiN passivation stress reduction by dispensing with a "triple point," e.g., by decoupling a capping-barrier interface from a passivation top surface (e.g., SiN).

One or more embodiments may involve a modification of a, e.g., Cu RDL process flow depositing a dielectric layer on top of the passivation before the definition of the vias structures; maintaining it after the removal of the copper seed and barrier layers; partially removing the dielectric layer after the deposition of the RDL capping layers.

BRIEF DESCRIPTION OF THE SEVERAL VIEWS OF THE DRAWINGS

One or more embodiments will now be described, purely by way of example, with reference to the annexed figures, in which.

It will be appreciated that for the sake of clarity of representation certain features of the figures (e.g., layer thicknesses) may not be drawn to a same scale.

DETAILED DESCRIPTION

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
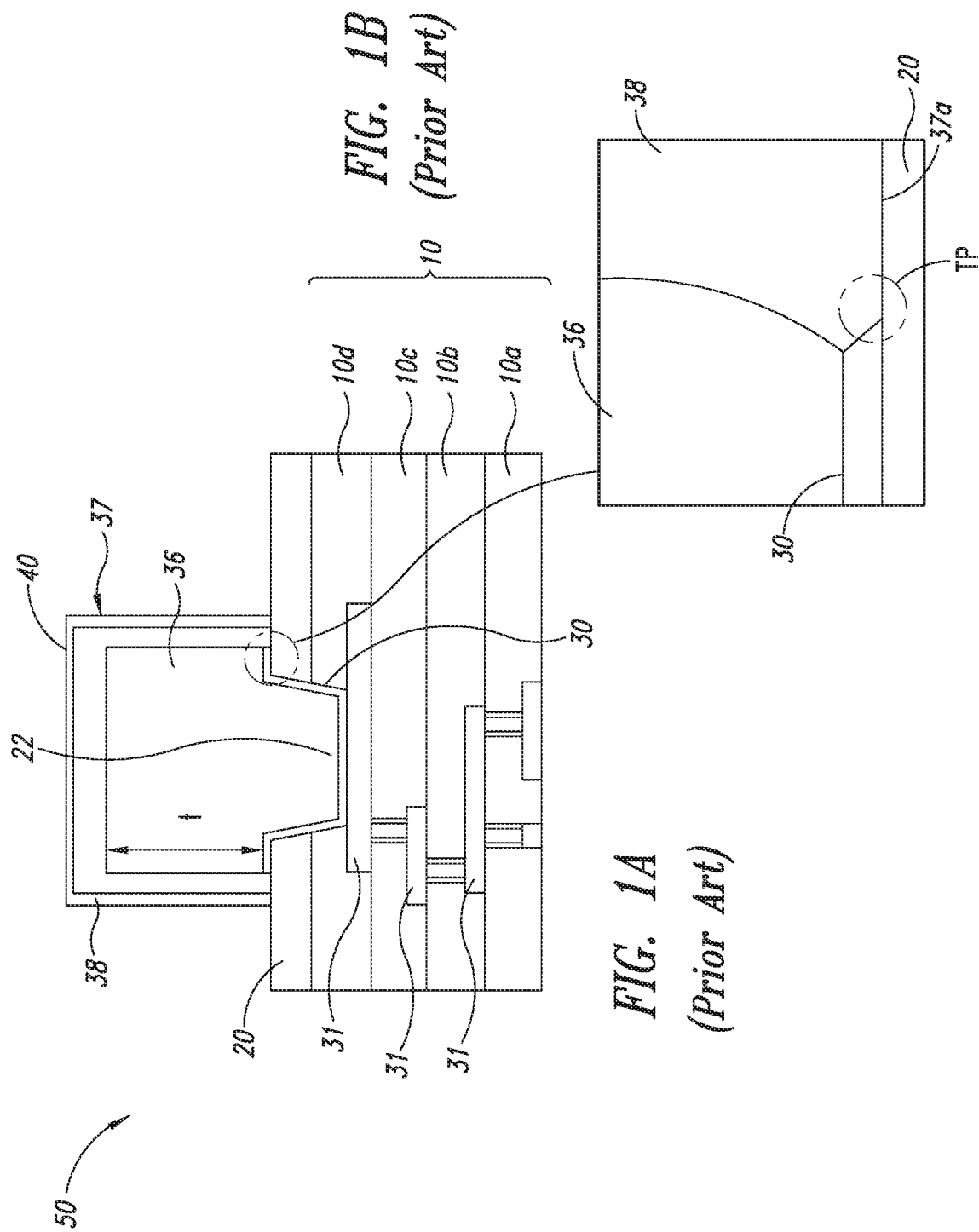
FIGS. 1A and 1B have been already described in the foregoing.
Figure 2:
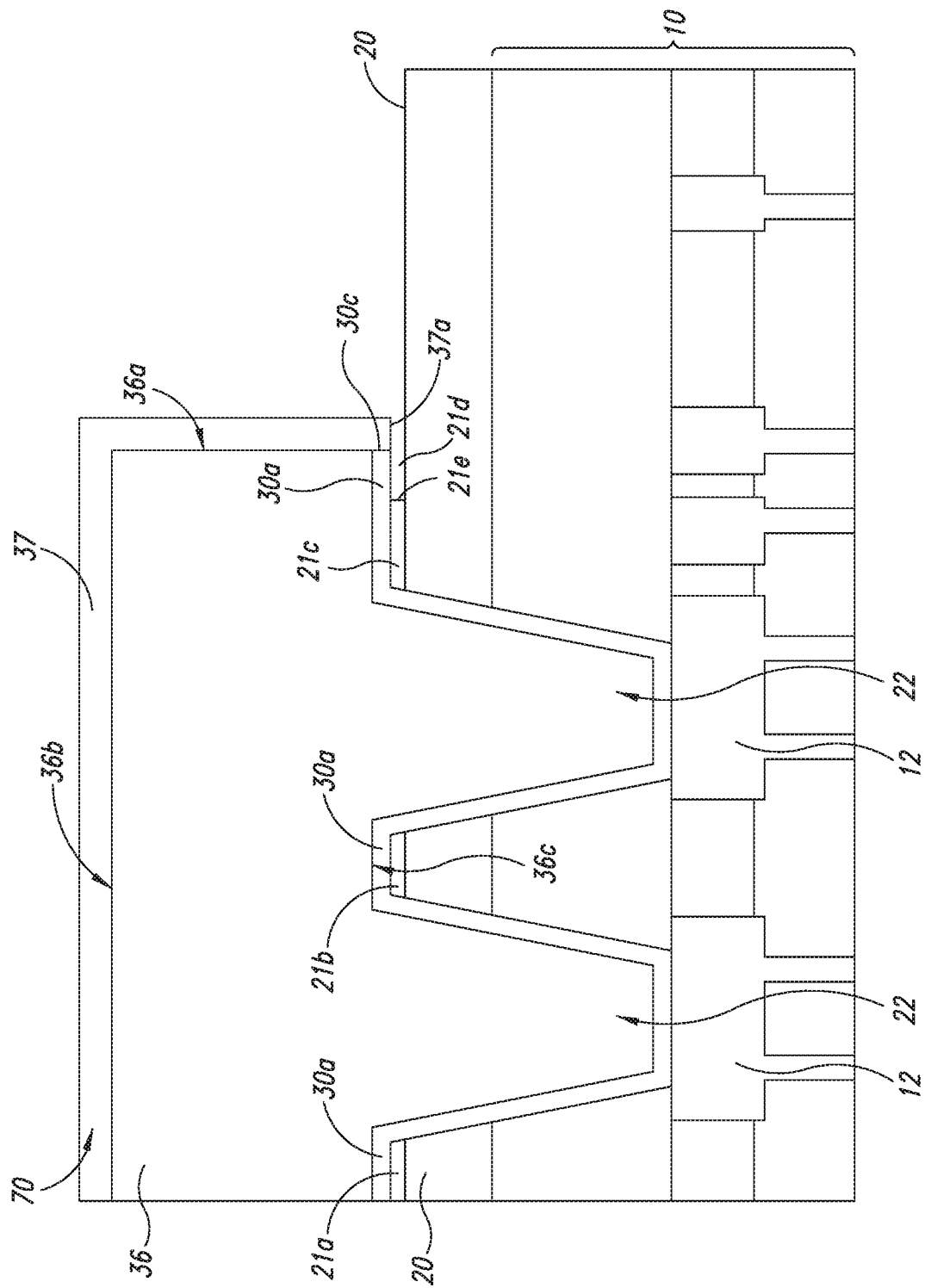
FIG. 2 represents an embodiment of the semiconductor device here described.

In FIG. 2 it is shown it is shown a semiconductor device in the form of a portion of integrated circuit 70 according to the solution here described. Equal numbers indicates elements having a function analogous to the one with the same reference number in FIGS. 1A and 1B.

Such a portion of integrated circuit 70, like the portion of integrated circuit 50 of FIGS. 1A and 1B, includes an interconnection metallization 36, which corresponds to a Cu redistribution layer, on a passivation layer 20 over a dielectric layer 10, where two vias 22 pass through such passivation layer 20 and part of the dielectric layer 10, in order to provide respective contacts. Although two vias 22 are shown in FIG. 2, one could employ any number of vias 22 or no vias according to the present disclosure. The interconnection metallization 36 is arranged over such via 22 to provide a top metallization level over the portion of integrated circuit 70. The passivation layer 20, as in FIGS. 1A and 1B, underlies peripheral portions of the Cu re-distribution layer 36, in particular of its copper metallization body. Such peripheral portions corresponds for instance to the portions at the corner formed by the flat area of a lower face 36c and the lateral wall 36a of the copper RDL 36. The passivation layer 20 is separated from said peripheral portion of such Cu redistribution layer 36 by the barrier layer 30, which in variant embodiments could be Ti, or Ta, or one of their alloys, such as TiN, TiW and TaNTa, and it is a layer which extends under the area of the lower face 36c of the Cu redistribution layer 36, interposing between the portion of passivation layer 20 facing the Cu redistribution layer 36 and also covering the via 22. As shown in FIG. 2, the Cu redistribution layer 36 is substantially a conductive track having a parallelepiped shaped body including a top face 36b, which is substantially a horizontal plane facing upwards, the lower face 36c which is a horizontal plane facing the passivation layer 20, protrusions 36p extending downward through the level of the passivation layer 20 filling the vias 22, and lateral walls 36a. In FIG. 2 only one of said lateral walls is visible, which are substantially vertical walls. It has to be said that the Cu RDL layer 36 can have also different shapes, but it is in general possible to identify a top surface for the contact, for instance by another chip disposed above through a solder bump, a bottom surface, part of which contact the passivation layer and part of which fills the via, and at least one lateral surface.

In the dielectric layer 10 are present electrically conductive (e.g., copper, or, alternatively, an AlCu alloy) formations 12, which operates as connections for the metal conduction tracks within the dielectric layer and towards the active circuitry of the semiconductor device.

The barrier layer 30 of the portion of integrated circuit 70 shown in FIG. 2 includes upper planar portions 30a formed above the passivation layer 20 and via portions 30b that coat the sidewalls and bottoms of the vias 22. The integrated circuit 60 also presents thin dielectric layers 21a, 21b, 21c deposited on the upper surfaces of the passivation layer 20. The thin dielectric layers 21a-c can be for instance low thermal silicon nitride layers (LTN) or a thin silicon oxide layers (e.g., 100-500 nm of thickness). The thin dielectric layers 21a-c are interposed between the upper surfaces of the passivation layer 20 and lower surfaces of the upper planar portions 30a of the barrier layer 30. The peripheral thin dielectric layer 21c has a surface which is substantially congruent with that of a peripheral one of the upper planar portions 30a of the barrier layer 30 with the exception of the region of a peripheral recess 21d, i.e., a region under an edge 30c of the peripheral upper planar portion 30a of the barrier layer 30. That is, the peripheral thin dielectric layer 21c does not extend all of the way to the edge 30c of the peripheral upper planar portion 30a of the barrier layer 30 and has an edge 21e that defines a side wall of the peripheral recess 21d. The edge 30c of the peripheral upper planar portion 30a of the barrier layer 30 is adjacent to a foot 37a of the metallization capping layer 37, i.e., the foot of the portion of capping layer 37 which covers the vertical wall 36a, which is spaced apart from the upper surface of the passivation layer 20 by the peripheral recess 21d, unlike the capping layer in FIGS. 1A and 1B which rests on the passivation layer 20. The peripheral recess 21a is hollow, i.e., is a region where the thin dielectric layer 21c is absent, more in particular is a hollow region formed by the removal of a portion of the peripheral thin dielectric layer 21c. It is underlined that also the passivation layer 20 portion external to the Cu RDL metallization 36 is not covered by the thin dielectric layer 21c. Therefore, the portion of integrated circuit 70 shown in FIG. 2 does not present the triple point TP, i.e., (contact point of layers 30, 37, and 20), since the capping layer 37 is separated by the recess 21d from the passivation layer 20. Such solution avoids the direct discharge of the intrinsic stress of the metallization layers onto the passivation layer.

Now the manufacturing process of the portion of integrated circuit 70 will be described.

Figure 3:
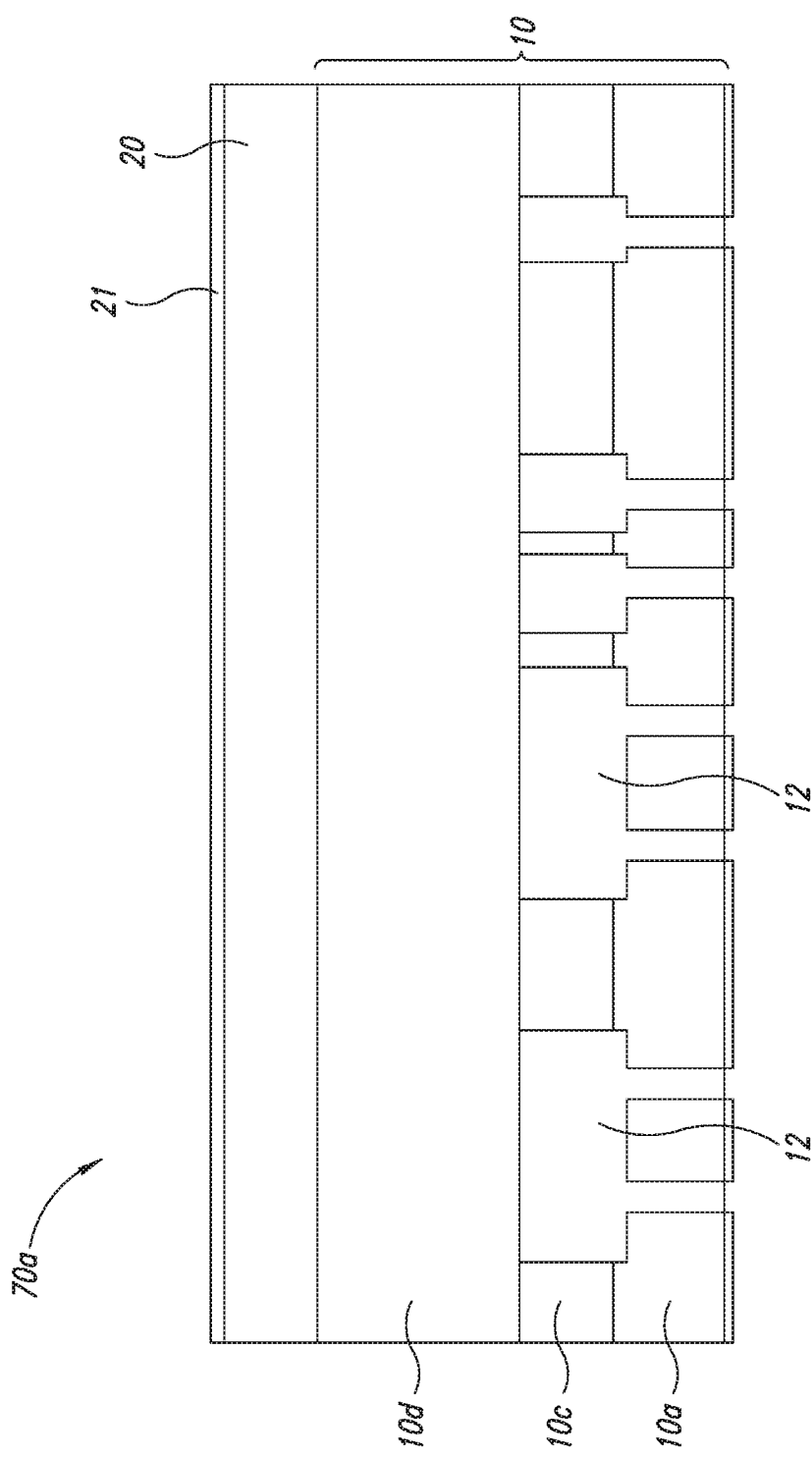
FIGS. 3 to 8 are exemplary of possible steps of one or more embodiments of a manufacturing method of the semiconductor device here described.

In particular, in FIG. 3 is represented a first intermediate structure 70a, including the dielectric layer 10. The passivation layer 20 then lies above the uppermost sub-layer 10d. As mentioned, the intermediate structure 70a can be connected through the conductive portions 12 to active circuitry, as the first intermediate structure 70a is a portion, represented in cross-section, of a semiconductor device which can be for instance a device produced with BCD (Bipolar-CMOS-DMOS) technology.

The intermediate structure 70a represents the portion of a chip that will lie immediately underneath the Cu RDL top metallization and obtained by standard process flow for BCD platforms, where layers 10d and 20 are normally dielectric materials, respectively made by silicon oxide and silicon nitride, usually reaching a total thickness higher than 1 micron.

Subsequently, a step of deposition of an initial thin dielectric layer 21 is performed. The initial thin dielectric layer 21 is preferably a low thermal silicon nitride layer (LTN) deposited by CVD (chemical vapor deposition) or a thin silicon oxide layer (e.g., 100-500 nm).

It is important that the new layer 21c presents a different resistance to the wet or dry etching processes with respect to the SiN passivation layer 20 in order to be subsequently removed with a good selectivity, avoiding an excessive consumption of the passivation layer 20.

Figure 4:
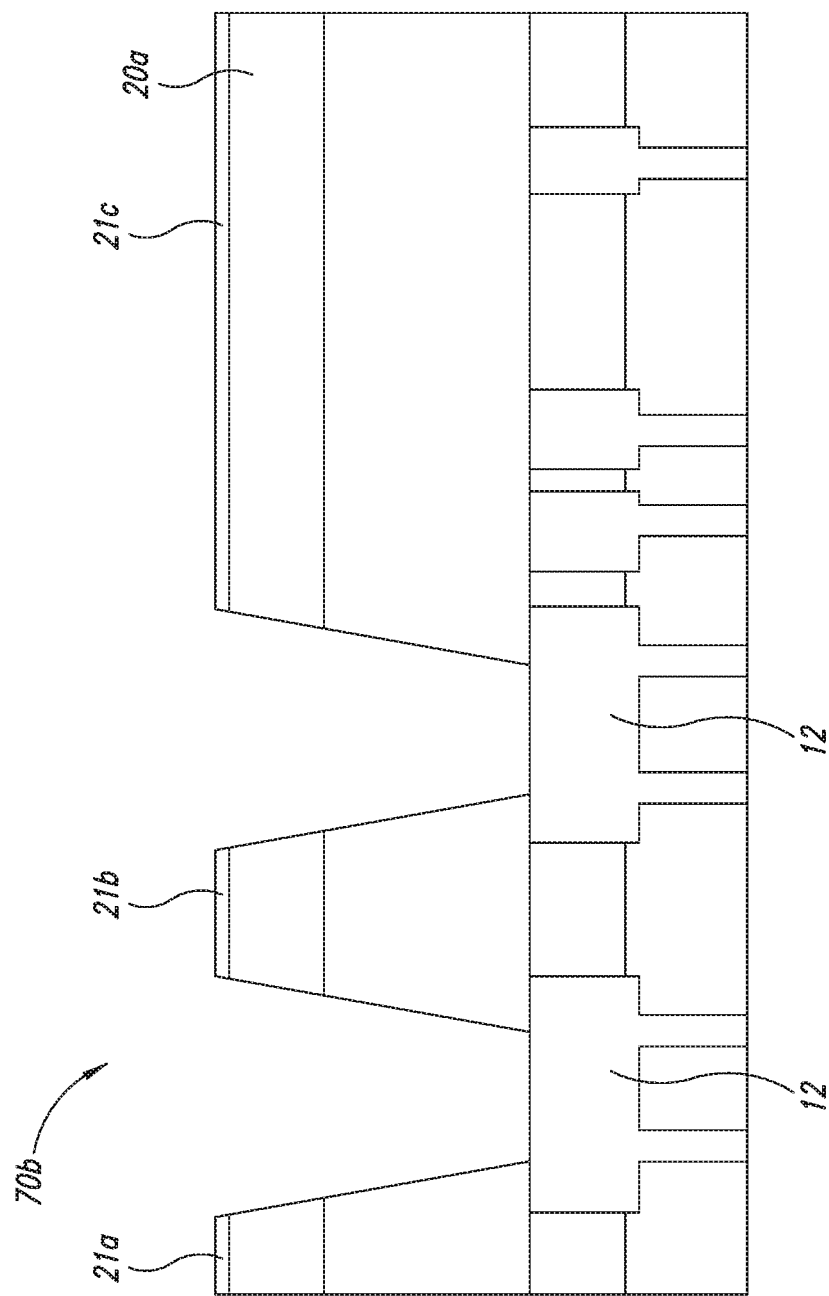

In FIG. 4 it is represented a second intermediate structure 70b, obtained from the first intermediate structure 70a etching vias 22 through the thin dielectric layer 21 to produce the dielectric layers 21a-c, the passivation layer 20 and the inter-layer dielectric layer 10d landing on the conductive formations 12 (e.g., copper or AlCu), for instance with a via width/space both higher than one micron. The formation of the vias 22 includes masking the layer 21 with a polymer mask (not shown), etching the vias 22 through the polymer mask, and removing the polymer mask after etching is complete.

Figure 5:
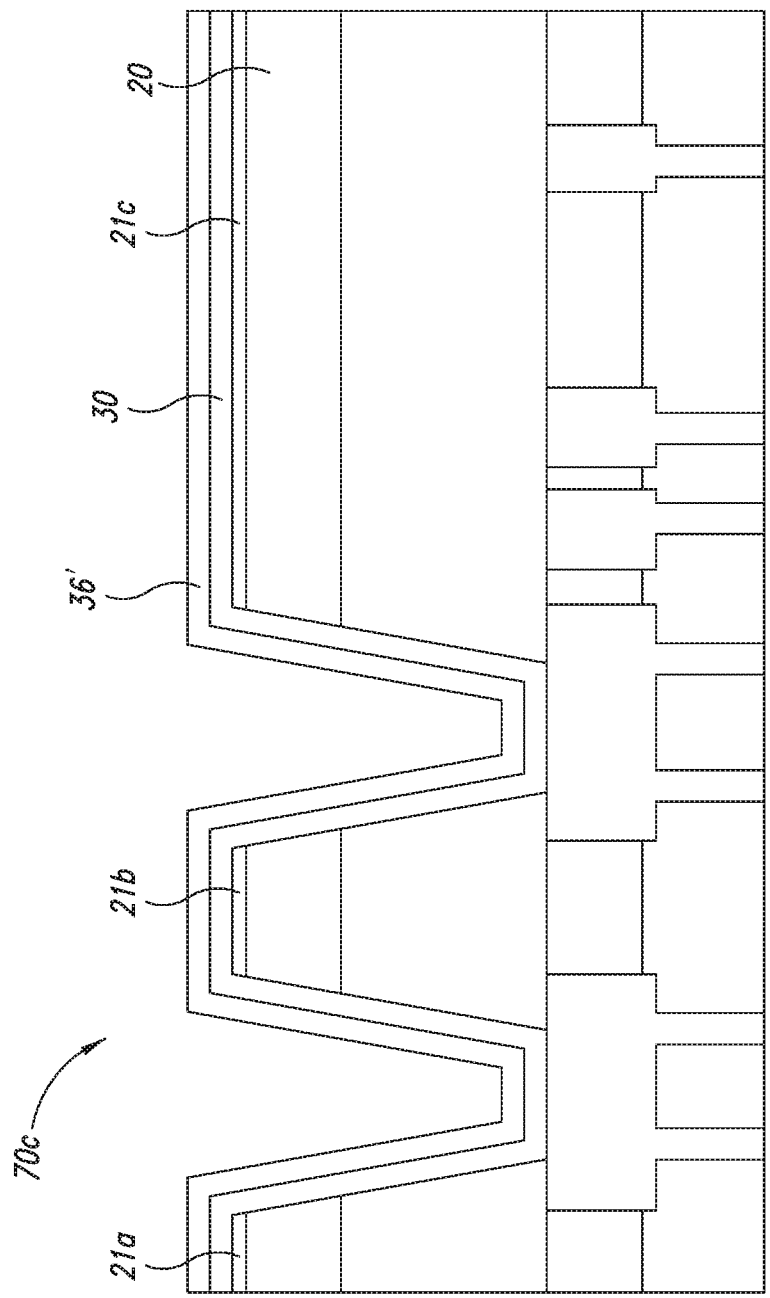

As shown in FIG. 5, then a third intermediate structure 70c is obtained by barrier and Cu seed deposition, also this corresponding to a standard Cu RDL manufacturing flow, which can include, by way of example:
  a step of barrier layer 30 deposition, that could be made by Ti, or Ta, or one of their alloys, such as TiN, TiW and TaNTa, for instance having a thickness higher than 100 nm, followed by
  a step of a copper seed layer 36' deposition having a thickness higher than 100 nm.

Figure 6:
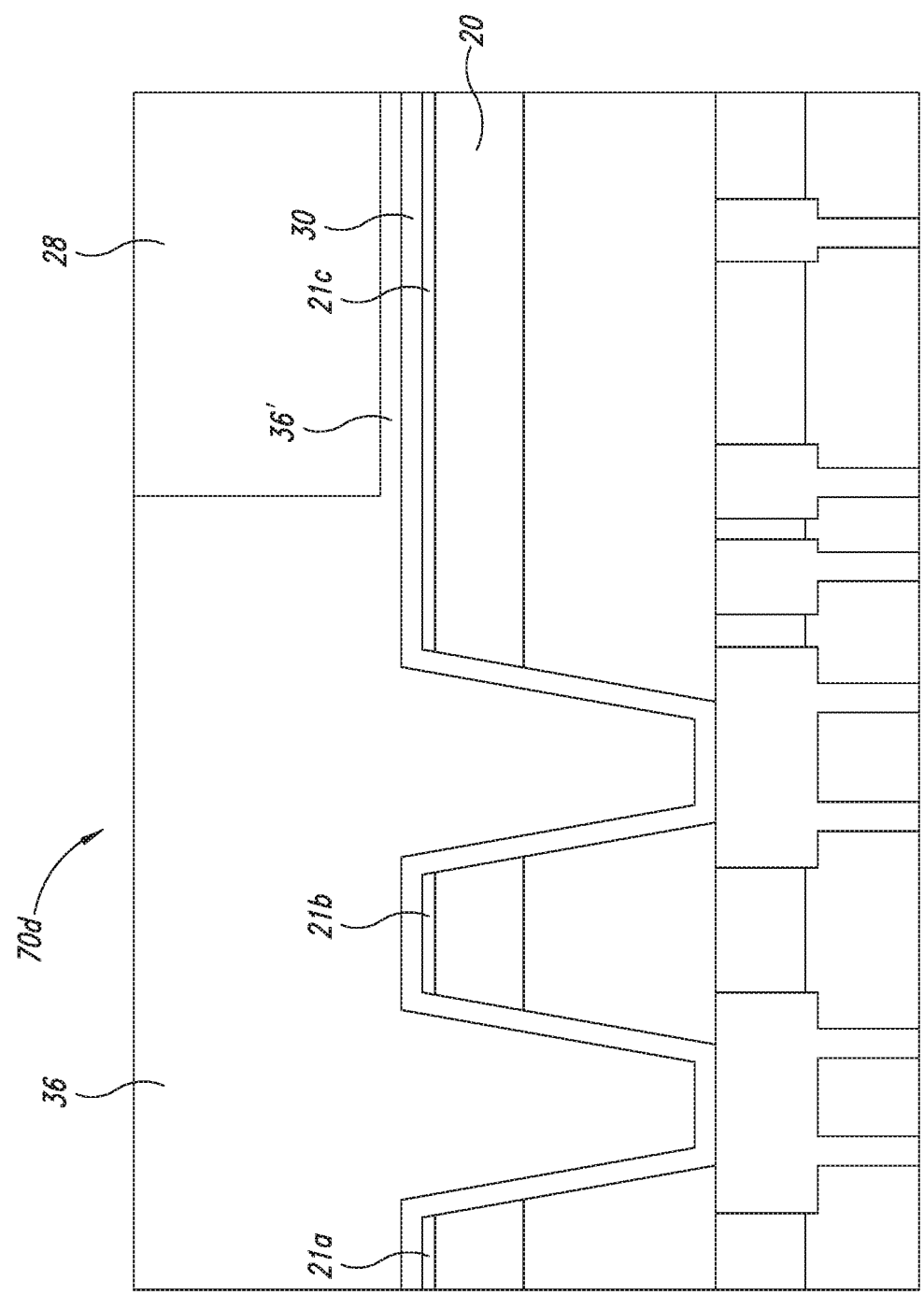

In FIG. 6, it is represented a fourth intermediate structure 70d, obtained from the third intermediate structure 70c, with the provision of a mask 28 over a peripheral portion of the seed layer 36', which leaves uncovered the area around the vias 22, to be covered with the body of the Cu RDL layer 36, specifically an area corresponding to the area of the bottom face 36c. Subsequently an operation of copper growth is performed, forming the metal layer 36 e.g., Cu RDL over and in the vias 22. In one or more embodiments, the metal layer 36 may have a thickness higher than 1 micron. In one or more embodiments, the metallization 36 may be formed by electrochemical deposition (ECD).

Figure 7:
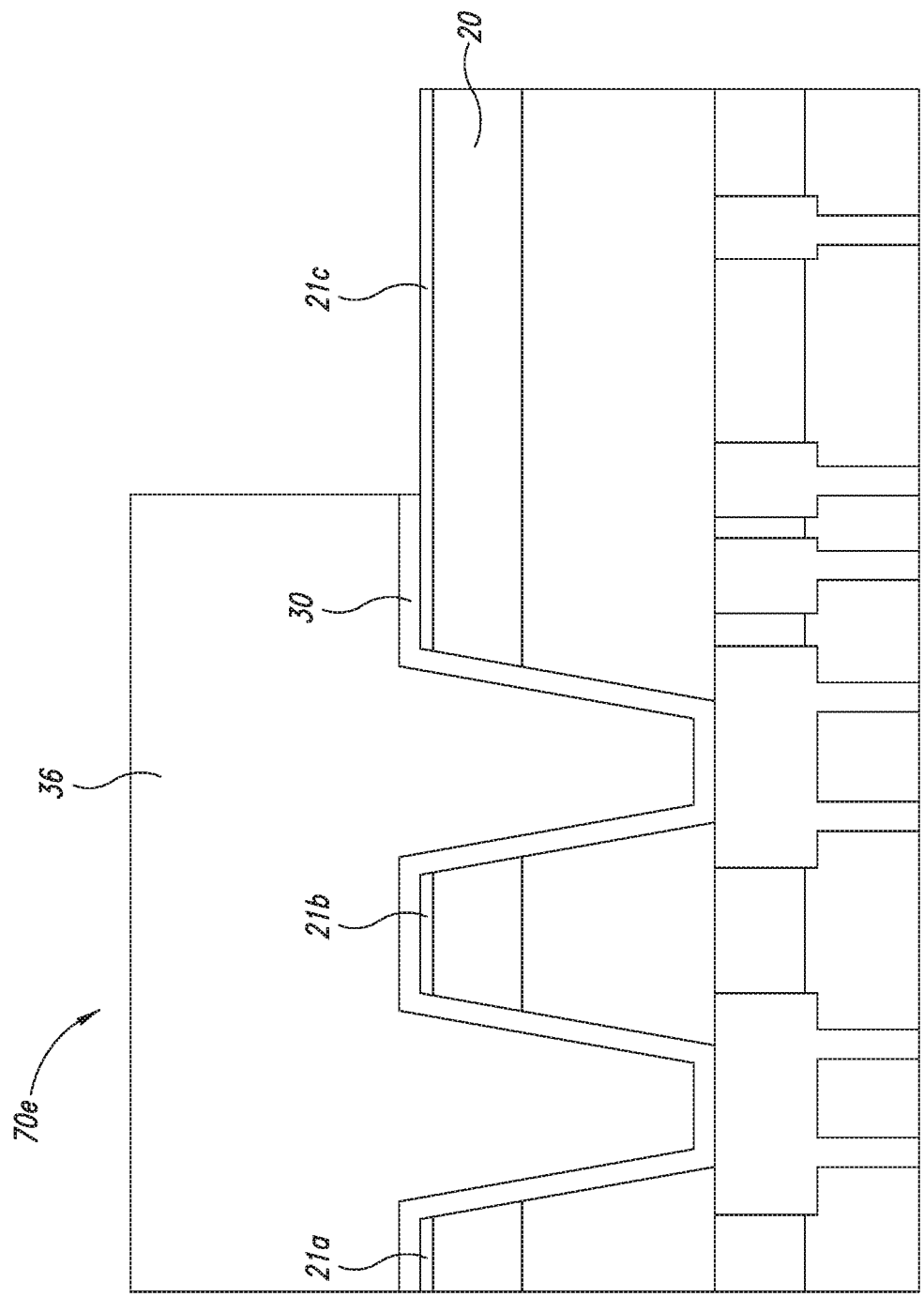

In FIG. 7, it is represented a fifth intermediate structure 70e, obtained from the fourth intermediate structure 70d, where the mask 28 and the portions of the Cu "seed" layer 36' and the barrier layer 30 that were covered by the mask 28 have been removed. In one or more embodiments, the fifth intermediate structure 70e of FIG. 7 is obtained by a removal operation of the procedure of copper features definition which includes:
  a step of removal ("stripping") of the mask 28,
  a step of removal of the portions of the Cu "seed" layer 36' and of the barrier layer 30 that were covered by the mask 28 (e.g., through a wet etch process) from all the surfaces left uncovered by the metal layer 36, maintaining the thin dielectric layer 21c.

Figure 8:
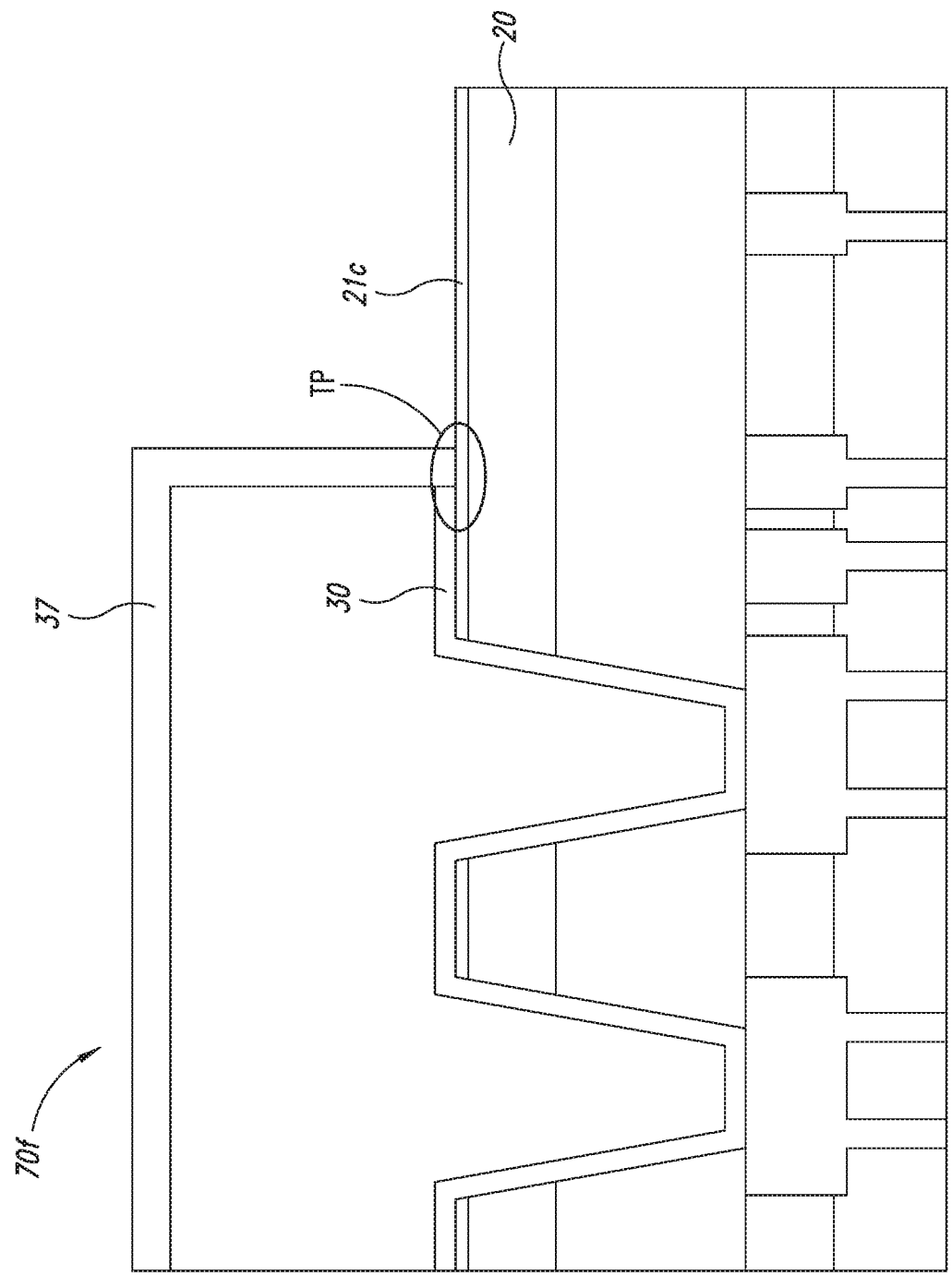

Then FIG. 8 shows a sixth intermediate structure 70f, obtained from the fifth intermediate structure 70e by performing the electroless deposition of a combined capping layer 37 on the metallization 36. The layer 37 may include the inner layer 38, which could be composed by Nickel or a Ni alloy, as for instance NiP, NiPW, NiPMo, and the outer layer 40 which could include noble metals, such as Au, Pd, or Pd/Au, as discussed above with respect to FIGS. 1A-1B.

The thickness of the two capping layers, 38 and 40, combined together could be higher than one micron. On the sixth intermediate structure 70f of FIG. 8 is then performed a further process step of selective wet etch of the peripheral thin dielectric layer 21c. The wet etch operation should be selective enough to etch only the thin layer 21 without any effect on the metal layers 38, 40, the barrier layer 30 and the passivation layer 20. This can be obtained for instance by dilute HF chemistry. Also, it is provided to tune the etch rate to guarantee a robust process, i.e., the etch rate should be low enough to control adequately the undercut of the recess 21d below the barrier 30. The etching process possibly removes the portions of the dielectric layer 21c beneath the metal capping layer 37 and beneath, while at the same time it keeps the undercut beneath the peripheral barrier layer portion 30a to a minimal amount in order to minimize the risk of metal peelings.

At the end of such a procedure the portion of integrated circuit 70 of FIG. 2 is obtained.

Again, it will be appreciated that a direct consequence of the last step is the elimination of the "triple point" TP (contact point of layers 30, 37, and 20) which is the area with the highest mechanical stress during high thermal budgets.

It will be otherwise appreciated that the specific choices of material as exemplified in the foregoing are primarily related to certain process embodiments, e.g., in connections with the re-distribution layer process flow. In one or more embodiments, different implementation options may dictate, e.g., different choices of materials and/or layer thicknesses.

In variant embodiments, during the deposition of the barrier layer 30 it can be obtained a single layer with a different type of barriers or the barriers can be adjusted as multilayer, for instance a multilayer including layers of TiW with a different Ti ratio. The multilayer in variant embodiments can contains layers of TiW, TiN, Ti, Ta, TaNTa, also combinations of these different materials. The single layer can have a thickness in the range 40-4000 A. One or more embodiments may thus provide a method of manufacturing semiconductor devices that includes:

defining the dielectric substrate 10 and the passivation layer 20,
  depositing said dielectric layer 21,
  defining vias 22 through the dielectric layer 21, passivation layer 20 and said dielectric substrate 10,
  growing of a metallization 36, obtained through a copper seed layer deposition and a metallization growth step, in particular by ECD, followed by a removal of the metal seed deposition and of the barrier layer 30 over the passivation layer 20 not covered by the metallization (36),
  the method further including depositing the outer surface coating 38, 40 to enclose the metallization 36, and
  performing a selective wet etch of the dielectric layer 21 to form the hollow recess 21a under the edge 30a of said barrier layer 30 and under the foot 37a of a vertical wall of the outer surface coating 37.

In the same way, with reference to the device, one or more embodiments may provide a semiconductor device 70 including:

at least one via 22 through said passivation layer 20 and said dielectric layer 10,
  at least one interconnection metallization 36 arranged over said at least one via 22,
  said passivation layer 20 underlying peripheral portions of said interconnection metallization 36,
  said at least one interconnection metallization 36 including a metallization body (36), preferably including copper, that is covered by an outer surface coating 37, said coating preferably including at least one of a nickel (or Ni alloy) layer (38) and a noble metal layer 40,
  said passivation layer 20 being separated from said peripheral portion of said at least one interconnection metallization 36 by an interposed diffusion barrier layer 30, preferably a titanium (or titanium alloy) barrier,
  a dielectric layer 21 arranged between said passivation layer 20 and said diffusion barrier layer 30, said dielectric layer 21 not extending beyond an edge 30a of the diffusion barrier layer 30, and
  a hollow recess area 21d, where said dielectric layer 21 is absent, between said passivation layer 20 and the edge 30a of said barrier layer 30 and between said passivation layer 20 and a foot of a vertical wall of the outer surface coating 37.

One or more embodiments may provide a device wherein said dielectric layer 21 is a thin layer under a micrometer of thickness.

One or more embodiments may provide a device wherein said dielectric layer 21 is a low thermal silicon nitride layer (LTN) or a thin silicon oxide layer.

One or more embodiments may provide a device wherein said interconnection metallization 36 is a copper re-distribution layer.

One or more embodiments may provide a device wherein said passivation material is silicon nitride.

One or more embodiments may provide a device wherein said at least an interconnection metallization 36 on a passivation layer 20 over a dielectric layer 10 are included in an integrated circuit or chip or die, in particular obtained by a BCD (Bipolar-CMOS-DMOS) technology.

Thermo-mechanical simulations confirm that the presence of the hollow recess 21d produces a significant reduction of the stress on passivation.

Without prejudice to the underlying principles, the details and embodiments may vary, even significantly, with respect to what has been disclosed merely by way of example, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, including:
  a first dielectric layer;
  a passivation layer over the dielectric layer;
  a via through said passivation layer and said dielectric layer;
  an interconnection metallization arranged over said via and having a metallization body and a peripheral portion on the passivation layer;
  an outer surface coating that coats said metallization body;
  a diffusion barrier layer separating the peripheral portion of the interconnection metallization from the passivation layer;
  a second dielectric layer arranged between said passivation layer and said diffusion barrier layer; and
  a hollow recess area between said passivation layer and an end portion of said barrier layer and between said passivation layer and a foot of the outer surface coating.

2. The device of claim 1, wherein said second dielectric layer is under a micrometer of thickness.

3. The device of claim 1, wherein said second dielectric layer is a low thermal silicon nitride layer or a thin silicon oxide layer.

4. The device of claim 1, wherein said interconnection metallization is a copper re-distribution layer.

5. The device of claim 1, wherein said passivation layer is silicon nitride.

6. The device of claim 1, wherein said interconnection metallization, passivation layer, and first dielectric layer are included in a BCD (bipolar-CMOS-DMOS) integrated circuit on a chip.

7. The device of claim 1, wherein said interconnection metallization includes copper.

8. The device of claim 1, wherein said outer surface coating includes at least one of a nickel or nickel alloy layer and a noble metal layer.

9. The device of claim 1, wherein said diffusion barrier layer is a titanium or titanium alloy barrier.

10. The device of claim 1, wherein:
  the diffusion barrier layer has an upper planar portion positioned directly on the second dielectric layer;

the end portion of the diffusion barrier layer is an end of the upper planar portion and includes a lateral edge that contacts a side wall of the foot of the outer surface coating; and the second dielectric layer has a lateral edge that defines a side wall of the hollow recess area.

11. A device comprising:

a passivation layer;

an interconnection metallization having a peripheral portion on the passivation layer;

a diffusion barrier layer separating the peripheral portion of the interconnection metallization from the passivation layer;

an outer surface coating that coats said interconnection metallization, the outer surface coating including a lateral wall having a foot that is adjacent to an end portion of the diffusion barrier layer;

a dielectric layer arranged between said passivation layer and said diffusion barrier layer; and a hollow recess area between said passivation layer and the end portion of said barrier layer and between said passivation layer and the foot of the outer surface coating, said dielectric layer defining a side wall of the hollow recess area.

12. The device of claim 11, wherein said hollow recess area has a vertical height under a micrometer.

13. The device of claim 11, further comprising a via that extends through the passivation layer, wherein the interconnection metallization includes a protrusion extending into the via.

14. The device of claim 13, wherein the diffusion barrier layer covers a side surface of the passivation layer that defines a sidewall of the via and is positioned in the via between the interconnection metallization and the side surface of the passivation layer.

15. The device of claim 11, wherein:

the diffusion barrier layer has an upper planar portion positioned directly on the dielectric layer;

the end portion of the diffusion barrier layer is an end of the upper planar portion and includes a lateral edge that contacts a side wall of the foot of the outer surface coating; and the second dielectric layer has a lateral edge that defines the side wall of the hollow recess area.

16. A semiconductor device, including:

a first dielectric layer;

a passivation layer over the dielectric layer;

a via through said passivation layer and said dielectric layer;

an interconnection metallization having a metallization body, extending in and above the via, and a peripheral portion on the passivation layer;

an outer surface coating that coats the interconnection metallization;

a diffusion barrier layer including a peripheral portion and via portion, the peripheral portion of the diffusion barrier layer separating the peripheral portion of the interconnection metallization from the passivation layer and the via portion extending in the via and separating the metallization body from walls of the first dielectric layer and passivation layer that define walls of the via;

a second dielectric layer arranged between said passivation layer and the peripheral portion of the diffusion barrier layer; and a hollow recess area between said passivation layer and an end portion of said diffusion barrier layer and between said passivation layer and a foot of the outer surface coating.

17. The device of claim 16, wherein said interconnection metallization is a copper re-distribution layer.

18. The device of claim 16, wherein said interconnection metallization, passivation layer, and first dielectric layer are included in a BCD (bipolar-CMOS-DMOS) integrated circuit on a chip.

19. The device of claim 16, wherein the second dielectric layer has a lateral edge that defines a side wall of the hollow recess area.

20. The device of claim 19, wherein the end portion of the diffusion barrier layer is an end of the peripheral portion and includes a lateral edge that contacts a side wall of the foot of the outer surface coating.

* * * * *